(12) United States Patent
Chen et al.

(10) Patent No.: US 11,171,166 B2
(45) Date of Patent: Nov. 9, 2021

(54) CAMERA ASSEMBLY AND PACKAGING METHOD THEREOF, LENS MODULE, ELECTRONIC DEVICE

(71) Applicant: Ningbo Semiconductor International Corporation, Ningbo (CN)

(72) Inventors: Da Chen, Ningbo (CN); Mengbin Liu, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 89 days.

(21) Appl. No.: 16/234,904

(22) Filed: Dec. 28, 2018

(65) Prior Publication Data

US 2020/0161350 A1    May 21, 2020

Related U.S. Application Data

(63) Continuation of application No. PCT/CN2018/119988, filed on Dec. 10, 2018.

(30) Foreign Application Priority Data

Nov. 20, 2018   (CN) .......................... 201811386732.3

(51) Int. Cl.
    *H01L 27/146*    (2006.01)
    *H01L 31/18*     (2006.01)
    (Continued)

(52) U.S. Cl.
    CPC ........ *H01L 27/14618* (2013.01); *G03B 17/12* (2013.01); *H01L 21/4853* (2013.01);
    (Continued)

(58) Field of Classification Search
    None
    See application file for complete search history.

(56) References Cited

U.S. PATENT DOCUMENTS

2008/0308928 A1* 12/2008 Chang .................... H01L 24/24
                                                    257/723
2011/0227190 A1*  9/2011 Chang et al. ....... H01L 23/3114
                                                    257/506
(Continued)

FOREIGN PATENT DOCUMENTS

CN          103456754 A     12/2013
CN          103700634 A      4/2014
                (Continued)

*Primary Examiner* — Alexander G Ghyka
(74) *Attorney, Agent, or Firm* — Anova Law Group, PLLC

(57) ABSTRACT

The present disclosure provides a camera assembly and a packaging method thereof, a lens module, and an electronic device. The packaging method of the camera assembly includes: providing a carrier substrate and forming a redistribution layer (RDL) structure on the carrier substrate; providing functional components having solder pads; forming a photosensitive unit, including a photosensitive chip and an optical filter mounted on the photosensitive chip, that the photosensitive chip has solder pads facing the optical filter; temporarily bonding the optical filter of the photosensitive unit with the carrier substrate, and placing the functional components on the RDL structure, that each of the solder pads of the photosensitive chip and the solder pads of the functional components faces the RDL structure and electrically connects with the RDL structure; forming an encapsulation layer covering the carrier substrate, that the encapsulation layer is coplanar with a highest top of the photosensitive chip and the functional components; and removing the carrier substrate.

12 Claims, 7 Drawing Sheets

(51) Int. Cl.
  H01L 23/00 (2006.01)
  H01L 21/48 (2006.01)
  H01L 21/56 (2006.01)
  H01L 23/31 (2006.01)
  H01L 23/538 (2006.01)
  H04N 5/225 (2006.01)
  G03B 17/12 (2021.01)
(52) U.S. Cl.
  CPC .......... *H01L 21/565* (2013.01); *H01L 21/568* (2013.01); *H01L 23/3121* (2013.01); *H01L 23/5386* (2013.01); *H01L 23/5387* (2013.01); *H01L 23/562* (2013.01); *H01L 24/16* (2013.01); *H01L 27/1462* (2013.01); *H01L 27/1469* (2013.01); *H01L 27/14627* (2013.01); *H01L 27/14634* (2013.01); *H01L 27/14636* (2013.01); *H01L 27/14685* (2013.01); *H01L 31/1892* (2013.01); *H04N 5/2253* (2013.01); *H04N 5/2254* (2013.01); *H01L 2224/16227* (2013.01); *H01L 2924/351* (2013.01)

(56) References Cited

U.S. PATENT DOCUMENTS

| | | | |
|---|---|---|---|
| 2012/0038813 | A1 | 2/2012 | Jung et al. |
| 2013/0256910 | A1* | 10/2013 | Lee ............... H01L 23/5226 257/774 |
| 2013/0320471 | A1* | 12/2013 | Luan ............... H01L 27/14618 257/432 |

FOREIGN PATENT DOCUMENTS

| | | |
|---|---|---|
| CN | 203895459 U | 10/2014 |
| CN | 105244359 A | 1/2016 |
| CN | 106206485 A | 12/2016 |
| CN | 107958881 A | 4/2018 |

* cited by examiner

CAMERA ASSEMBLY AND PACKAGING METHOD THEREOF, LENS MODULE, ELECTRONIC DEVICE

CROSS-REFERENCES TO RELATED APPLICATIONS

This application is a continuation application of PCT Patent Application No. PCT/CN2018/119988, filed on Dec. 10, 2018, which claims priority to Chinese patent application No. 201811386732.3, filed on Nov. 20, 2018, the entirety of all of which is incorporated herein by reference.

FIELD OF THE DISCLOSURE

The present disclosure generally relates to the field of lens modules and, in particular, to a camera assembly, a packaging method thereof, a lens module, and an electronic device.

BACKGROUND

With the continuous improvement of people's living standards and abundance of hobbies, photo-capturing has gradually become a common means for people to record their outings and various aspects of their daily life. Thus, electronic devices (e.g., mobile phones, tablets, and cameras) with camera functions are widely used in people's daily life and work, and gradually become indispensable tools nowadays.

Electronic devices with camera functions are often configured with a lens module. The design level of the lens module plays an important role for determining quality of photographs taken by the electronic devices. The lens module often includes a camera assembly having a photosensitive chip and a lens assembly mounted on the camera assembly, used to capture images of photographed objects.

Moreover, to improve the imaging capability of the lens module, a photosensitive chip having a larger imaging area is needed, and passive components, such as resistors and capacitors, and peripheral chips are usually disposed in the lens module.

BRIEF SUMMARY OF THE DISCLOSURE

One aspect of the present disclosure provides a packaging method of a camera assembly, including: providing a carrier substrate and forming a redistribution layer (RDL) structure on carrier substrate; providing functional components having solder pads; forming a photosensitive unit, including a photosensitive chip and an optical filter mounted on the photosensitive chip, that the photosensitive chip has solder pads facing the optical filter; temporarily bonding the optical filter of the photosensitive unit with the carrier substrate, and placing the functional components on the RDL structure, that each of the solder pads of the photosensitive chip and the solder pads of the functional components faces the RDL structure and electrically connects with the RDL structure; forming an encapsulation layer covering the carrier substrate, that the encapsulation layer is coplanar with a highest top of the photosensitive chip and the functional components; and removing the carrier substrate.

Another aspect of the present disclosure provides a camera assembly, including: a photosensitive unit, functional components, a redistribution layer (RDL) structure, and an encapsulation layer, embedded with the photosensitive unit, the functional components, and the RDL structure. The photosensitive unit includes a photosensitive chip and an optical filter mounted on the photosensitive chip, the RDL structure and the optical filter are exposed from a top surface of the encapsulation layer, and a highest top of the photosensitive chip and the functional components is exposed from a bottom surface of the encapsulation layer. The photosensitive chip and the functional components have solder pads facing the RDL structure and electrically connecting with the RDL structure.

Another aspect of the present disclosure provides a lens module, including: the camera assembly according to exemplary embodiments of the present disclosure; and a lens assembly, including a support member. The support member is mounted on a top surface of the encapsulation layer and surrounds the photosensitive unit and the functional components. The lens assembly is electrically connected to the photosensitive chip and the functional components.

Another aspect of the present disclosure further provides an electronic device, including: the lens module according to exemplary embodiments of the present disclosure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
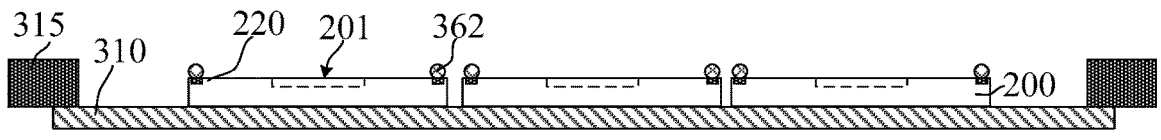
FIGS. 1-13 illustrate schematic cross-sectional views of structures corresponding to certain stages during an exemplary packaging method of a camera assembly according to some exemplary embodiments of the present disclosure.

The performance of a conventional lens module needs to be improved, and the conventional lens module is difficult to meet the needs of miniaturization and thinning of the lens module. The reasons are described as follows.

A conventional lens module is mainly assembled by a circuit board, a photosensitive chip, functional components (for example, peripheral chips), and a lens assembly. The peripheral chips are usually mounted on a peripheral motherboard, and the photosensitive chip and the functional components are separated from each other. The circuit board is used to support the photosensitive chip, the functional components, and the lens assembly. The circuit board is also used to realize electrical connections between the photosensitive chip, the functional components, and the lens module.

However, with the needs of high-pixel and ultra-thin lens modules, the imaging requirements of the lens module are getting higher, the area of the photosensitive chip is correspondingly increased, and the number of functional components is correspondingly increased, resulting in a larger size of the lens module and being difficult to meet the needs of miniaturization and thinning of the lens module. Moreover, the photosensitive chip is usually disposed inside a support member in the lens module, and the peripheral chips are usually disposed outside the support member, so that there is a certain distance between the peripheral chips and the photosensitive chip, thereby reducing the speed of signal transmission. The peripheral chips usually include digital signal processor (DSP) chips and memory chips, so that it is easy to adversely affect the shooting speed and the storage speed, thereby reducing the performance of the lens module.

Exemplary embodiments of the present disclosure provide a camera assembly, a packaging method thereof, a lens module, and an electronic device, while improving the performance of the lens module and reducing the overall thickness of the lens module.

In exemplary embodiments of the present disclosure, a photosensitive chip and functional components are integrated in an encapsulation layer, and a redistribution layer structure is used to realize electrical connections. Compared to a scheme in which the functional components are mounted on a peripheral motherboard, the exemplary embodiments of the present disclosure reduce the distance between the photosensitive chip and the functional components, and accordingly shorten the distance of the electrical connections between the photosensitive chip and the functional components, thereby significantly increasing the speed of signal transmission, thereby improving the performance of the lens module (for example, improving the shooting speed and the storage speed). By using the encapsulation layer and the redistribution layer structure, the circuit board is omitted, thereby reducing the overall thickness of the lens module to meet the needs of miniaturization and thinning of the lens module.

To make the above described objects, features and advantages of the present disclosure easier to be understood, the exemplary embodiments of the present disclosure are described in detail below with reference to the accompanying drawings.

FIGS. 1-13 illustrate schematic cross-sectional views of structures corresponding to certain stages during an exemplary packaging method of a camera assembly according to some exemplary embodiments of the present disclosure.

Figure 2:
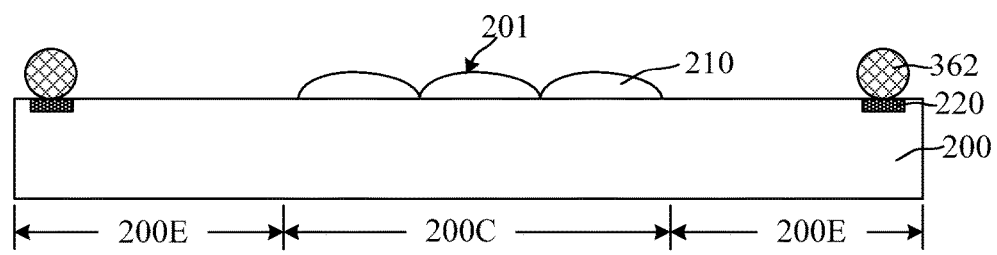
Figure 3:
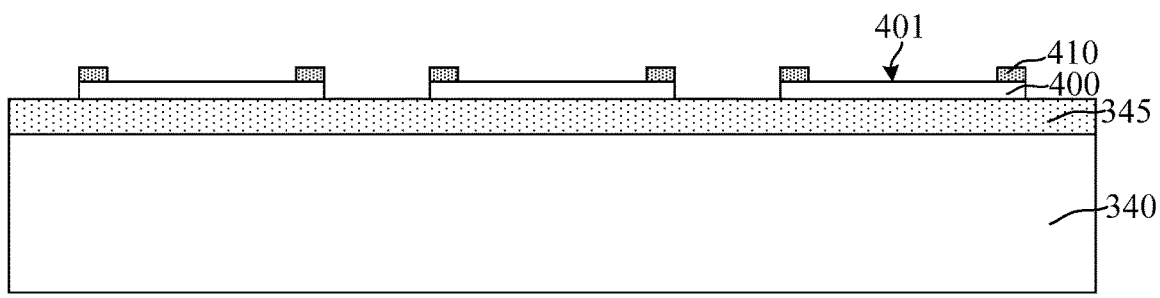
Figure 4:
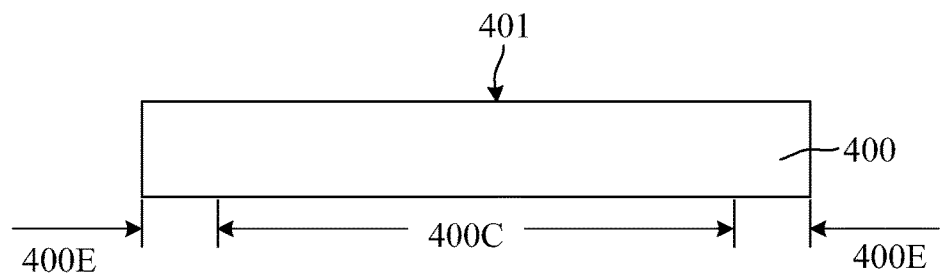

Referring to FIG. 1 to FIG. 5, FIG. 2 is an enlarged view of a photosensitive chip of FIG. 1, and FIG. 4 is an enlarged view of an optical filter of FIG. 3. A photosensitive unit 250 (shown in FIG. 5) is formed and includes a photosensitive chip 200 (shown in FIG. 5) and an optical filter 400 (shown in FIG. 5) mounted on the photosensitive chip 200. The photosensitive chip 200 has solder pads facing the optical filter 400.

The photosensitive chip 200 is an image sensor chip. In some embodiments, the photosensitive chip 200 is a CMOS image sensor (CIS) chip. In other embodiments, the photosensitive chip may also be a charge coupled device (CCD) image sensor chip.

In one embodiment, the photosensitive chip 200 has an optical signal receiving surface 201 (shown in FIG. 2), and the photosensitive chip 200 receives and senses optical radiation signal through the optical signal receiving surface 201.

For example, as shown in FIG. 2, the photosensitive chip 200 includes a photosensitive region 200C and a peripheral region 200E surrounding the photosensitive region 200C, and the optical signal receiving surface 201 is located at the photosensitive region 200C.

The photosensitive chip 200 includes a plurality of pixel units, and thus the photosensitive chip 200 includes a plurality of semiconductor photosensitive devices (not shown), and a plurality of optical filter films (not shown) on the plurality of semiconductor photosensitive device. The plurality of optical filter films is used to selectively absorb and pass optical signal received by the optical signal receiving surface 201. The photosensitive chip 200 further includes a plurality of microlens 210 on the plurality of optical filter films, and the plurality of microlens 210 is in one-to-one correspondence with the plurality of semiconductor photosensitive devices, thereby focusing the received optical radiation signal light to the corresponding plurality of semiconductor photosensitive devices. The optical signal receiving surface 201 corresponds to a top surface of the plurality of microlens 210.

It should be noted that the photosensitive chip 200 is generally a silicon-based chip and is fabricated by an integrated circuit fabrication technology. The photosensitive chip 200 has solder pads for electrically connecting the photosensitive chip 200 with other chips or components. In one embodiment, the photosensitive chip 200 has first chip solder pads 220 formed on the peripheral region 200E, and the first chip solder pads 220 are facing the optical filter 400. For example, a surface of the photosensitive chip 200 located on the same side of the optical signal receiving surface 201 exposes the first chip solder pads 220.

The photosensitive chip 200 is generally obtained by cutting a device wafer integrated with a plurality of photosensitive chips 200. Correspondingly, before the cutting, a first UV film 310 (shown in FIG. 1) is laminated to a surface of the device wafer facing away from the optical signal receiving surface 201, and used to position the device wafer, thereby improving the cutting precision, and also fix and position the plurality of photosensitive chips 200 after the cutting.

For example, as shown in FIG. 1, the first UV film 310 is laminated to the surface of the device wafer facing away from the optical signal receiving surface 201 by using a film laminating machine. The first UV film 310 is also laminated to a bottom of a first frame 315 with a larger diameter, and the first frame 315 is used as a stretch film, so that the plurality of photosensitive chips 200 can be discretely fixed on the first UV film 310 after the cutting. Any suitable UV film and frame may be used for the disclosed first UV film 310 and first frame 315 without limitation according to various embodiments of the present disclosure.

The optical filter 400 is mounted on the photosensitive chip 200 to prevent subsequent packaging processes from contaminating the optical signal receiving surface 201, and is also beneficial for reducing the overall thickness of the subsequent lens module to meet the needs of miniaturization and thinning the lens module.

The optical filter 400 is one of an infrared filter glass sheet and a fully transparent glass sheet. In one embodiment, the optical filter 400 is an infrared filter glass sheet, and is also used to eliminate the influence of infrared light in the incident light on the performance of the photosensitive chip 200, thereby improving the imaging effect. For example, the optical filter 400 is an infrared cut filter (IRCF), and the infrared cut filter may be a blue glass infrared cut filter, or may include a glass sheet and an IR cut coating on a surface of the glass sheet.

In one embodiment, the optical filter 400 includes a mounting surface 401 (shown in FIG. 3). The mounting surface 401 is a surface for mounting with the photosensitive chip 200, that is, a surface for facing the photosensitive chip 200.

For example, in the case when the optical filter 400 is a blue glass infrared cut filter, a surface of the blue glass infrared cut filter is coated with an antireflection coating or an antireflection film, and a surface opposite to the surface coated with the antireflection coating or the antireflection film is the mounting surface 401. In the case when the optical filter 400 includes a glass sheet and an IR cut coating on a surface of the glass sheet, a surface of the glass sheet opposite to the IR cut coating is the mounting surface 401. In other embodiments, when the optical filter is a fully transparent glass sheet, either surface of the fully transparent glass sheet may be a mounting surface.

As shown in FIG. 4, the optical filter 400 includes a light transmitting region 400C and an edge region 400E surrounding the light transmitting region 400C. The light transmitting region 400C is configured to transmit external incident light, so that the optical signal receiving surface 201 of the photosensitive chip 200 receives optical signal, to ensure the normal use function of the lens module. The edge region 400E is a reserved space to mount the optical filter 400 on the photosensitive chip 200.

Figure 5:
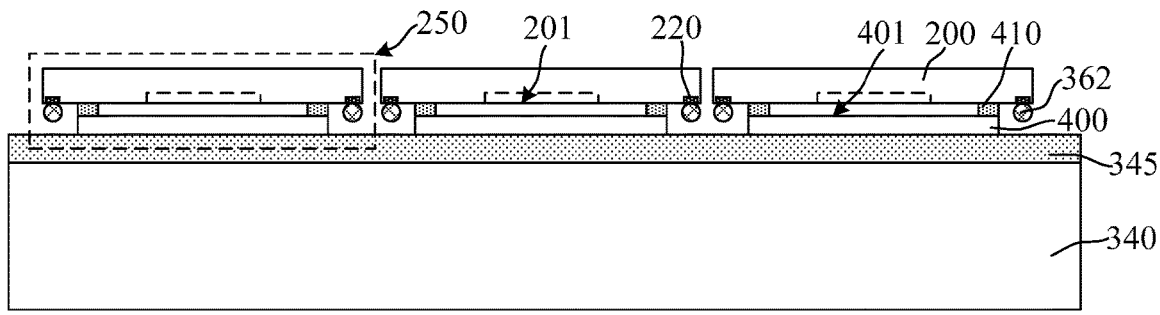

As shown in FIG. 5, in one embodiment, the optical filter 400 is mounted on the photosensitive chip 200 by an adhesive structure 410, and the adhesive structure 410 surrounds the optical signal receiving surface 201.

The adhesive structure 410 is used to realize physical connection of the optical filter 400 and the photosensitive chip 200. The optical filter 400, the adhesive structure 410, and the photosensitive chip 200 enclose a cavity (not labeled), avoiding direct contact of the optical filter 400 and the photosensitive chip 200, thereby preventing the optical filter 400 from adversely affecting the performance of the photosensitive chip 200.

In one embodiment, the adhesive structure 410 surrounds the optical signal receiving surface 201, so that the optical filter 400 above the optical signal receiving surface 201 is located on the photosensitive path of the photosensitive chip 200, therefore the performance of the photosensitive chip 200 is guaranteed.

For example, the material of the adhesive structure 410 is a photolithographic material. The adhesive structure 410 can be formed by a photolithography process, which not only may help in improving the morphological quality and the dimensional accuracy of the adhesive structure 410, and in improving packaging efficiency and production capacity, but also may reduce the impact on the bonding strength of the adhesive structure 410.

In one embodiment, the material of the adhesive structure 410 is a photolithographic dry film. In other embodiments, the material of the adhesive structure may also be one of a photolithographic polyimide, a photolithographic polybenzoxazole (PBO), and a photolithographic benzocyclobutene (BCB).

In one embodiment, to reduce the process difficulty of forming the adhesive structure 410, simplify the process steps, and reduce the influence of the forming process of the adhesive structure 410 on the optical signal receiving surface 201, the adhesive structure 410 is formed on the optical filter 400.

For example, the mounting steps include: as shown in FIG. 3, providing a first carrier substrate 340; temporarily bonding a surface of the optical filter 400 opposite to the mounting surface 401 with the first carrier substrate 340; forming the annular adhesive structure 410 in the edge region 400E (shown in FIG. 4) of the optical filter 400, after the temporary bonding; and as shown in FIG. 5, forming the photosensitive unit 250, by facing the optical signal receiving surface 201 of the photosensitive chip 200 to the annular adhesive structure 410 and mounting the peripheral region 200E (shown in FIG. 2) of the photosensitive chip 200 to the annular adhesive structure 410.

The first carrier substrate 340 is used to provide a process platform for the formation of the adhesive structure 410 and the mounting steps. In one embodiment, the first carrier substrate 340 is a carrier wafer. In other embodiments, the first carrier substrate may also be other types of substrates.

For example, the optical filter 400 is temporarily bonded with the first carrier substrate 340 via a first temporary bonding layer 345. The first temporary bonding layer 345 serves as a peeling layer to facilitate subsequent debonding.

In one embodiment, the first temporary bonding layer 345 is a foamed film. The foamed film includes a micro-adhesive surface and a foamed surface that are opposite to each other. The foamed film is adhesive at normal temperature, and the foamed surface is attached to the first carrier substrate 340. Subsequently the foaming film is heated to cause the foamed surface to lose adhesiveness, thus debonding is achieved. In other embodiments, the first temporary bonding layer may also be a die attach film (DAF).

With reference to FIG. 1 and FIG. 2, in one embodiment, the packaging method further includes forming first conductive bumps 362 on the first chip solder pads 220.

The first conductive bumps 362 protrude from a surface of the photosensitive chip 200, serve as external electrodes of the photosensitive chip 200, are prepared for electrical connections of the first chip solder pads 220 and a subsequent redistribution layer structure, and are beneficial to improve the electrical connection reliability of the first chip solder pads 220 and the subsequent redistribution layer structure.

In one embodiment, the first conductive bumps 362 are formed by a ball planting process. The overall thickness of the optical filter 400 and the adhesive structure 410 is large (for example, between about 200 micrometers and about 300 micrometers), and the first conductive bumps 362 formed by the ball bonding process are bulky, thereby being easy to realize contact between the first conductive bumps 362 and the redistribution layer structure.

In one embodiment, the first conductive bumps 362 are formed on a surface of the first chip solder pads 220 corresponding to the photosensitive chip 200 before the device wafer integrated with the plurality of photosensitive chip 200 is cut.

The ball planting process includes a reflow step. The process temperature of the reflow step is generally in a range of about 180° C. to about 350° C. The process temperature of the reflow step is high. By forming the first conductive bumps 362 before the cutting, the impact of the high temperature to the adhesiveness of the first UV film 310 to the first temporary bonding layer 345 (shown in FIG. 5) is avoided. Moreover, by forming the first conductive bumps 362 on the surface of the first chip solder pads 220, the accuracy of the position of the first conductive bumps 362 can be improved, thereby being advantageous for improving the feasibility of subsequent electrical connection process and the electrical connection reliability.

Figure 6:
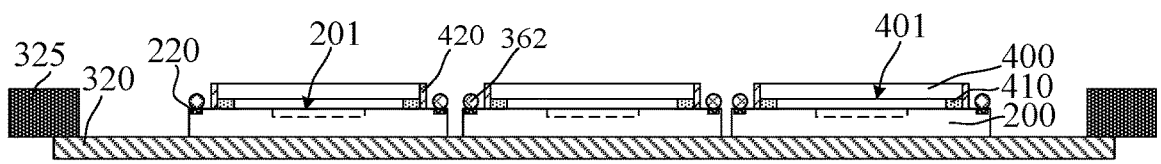

Referring to FIG. 6, after the photosensitive unit 250 is formed (as shown in FIG. 5), the photosensitive chip 200 is attached to a second UV film 320, before the first carrier substrate 340 (shown in FIG. 5) is removed by performing a first debonding process.

By attaching to the second UV film 320, it is advantageous to improve the positional accuracy of the photosensitive unit 250 on another carrier substrate. The adhesiveness of the second UV film 320 can be weakened under ultraviolet light, and the photosensitive unit 250 can be easily removed from the second UV film 320 in a sequent process.

For example, the second UV film 320 is in close contact with the surface of the photosensitive chip 200 facing away from the optical signal receiving surface 201, and is also attached to a bottom of a second frame 325 having a larger diameter. The second frame 325 serves as a stretch film, and the photosensitive unit 250 is discretely fixed to the second UV film 320. Any suitable UV film and frame may be used for the disclosed second UV film 320 and second frame 325 without limitation according to various embodiments of the present disclosure.

In one embodiment, the first temporary bonding layer 345 (shown in FIG. 5) is a foamed film, and thus the first debonding process is performed by using a pyrolysis bonding process. For example, the first temporary bonding layer 345 is subjected to a heat treatment to lose the adhesiveness of the foamed surface of the foamed film, thereby removing the first carrier substrate 340, and then removing the first temporary bonding layer 345 by peeling.

With continued reference to FIG. 6, the packaging method further includes forming a stress buffer layer 420 covering sidewalls of the optical filter 400.

The stress buffer layer 420 is beneficial to reduce the stress generated by a subsequently formed encapsulation layer on the optical filter 400 to reduce the probability of the optical filter 400 being broken, thereby improving the reliability and the yield of the packaging process. In particular, the optical filter 400 is an infrared filter glass sheet or a fully transparent glass sheet, and the glass sheet is highly susceptible to being broken due to stress, and the stress buffer layer 420 can significantly reduce the probability of the optical filter 400 being broken.

The stress buffer layer 420 is adhesive to ensure its adhesion on the optical filter 400. In one embodiment, the material of the stress buffer layer 420 is an epoxy adhesive. The epoxy adhesive is an epoxy resin adhesive. The epoxy adhesive has a variety of forms. By changing the composition of the epoxy adhesive, materials with different elastic modulus can be obtained, so the stress on the optical filter 400 can be regulated according to actual conditions.

In one embodiment, the stress buffer layer 420 also covers sidewalls of the adhesive structure 410 to reduce the stress generated by the encapsulation layer on the adhesive structure 410 to further improve the reliability and the yield of the packaging process.

In one embodiment, after the photosensitive unit 250 (shown in FIG. 5) is attached to the second UV film 320, the stress buffer layer 420 is formed by a dispensing process. By selecting the dispensing process, the compatibility of forming the stress buffer layer 420 with the current packaging process is improved, and the process is simple.

Figure 7:
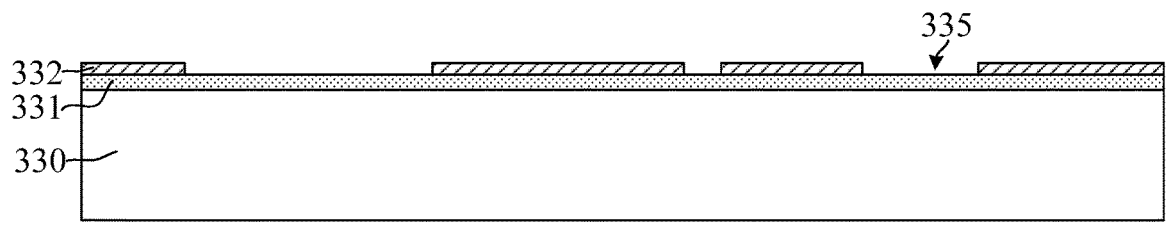
Figure 8:
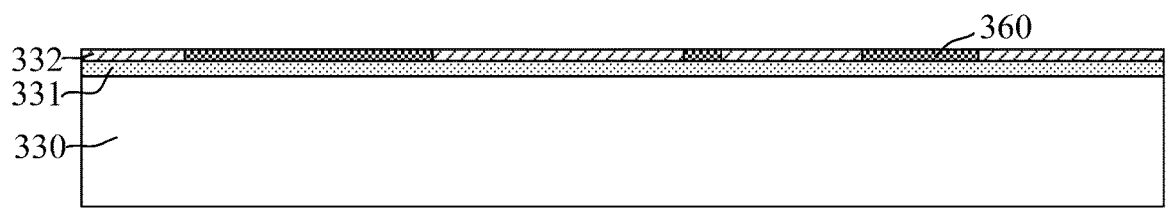

Referring to FIG. 7 and FIG. 8, a second carrier substrate 330 is provided, and a redistribution layer (RDL) structure 360 (shown in FIG. 8) is formed on the second carrier substrate 330.

The second carrier substrate 330 is used to provide a process platform to form the RDL structure 360. In one embodiment, the second carrier substrate 330 is a carrier wafer. In other embodiments, the second carrier substrate may also be other types of substrates.

In one embodiment, the packaging method further includes forming a second temporary bonding layer 331 on the second carrier substrate 330. The second temporary bonding layer 331 serves as a peeling layer to facilitate subsequent separation of the RDL structure 360 and the second carrier substrate 330. The second temporary bonding layer 331 may be a foamed film. For a detailed description of the second temporary bonding layer 331, reference may be made to corresponding description of the first temporary bonding layer 345 (shown in FIG. 5) and is not redundantly described here.

It should be noted that, in other embodiments, a passivation layer is formed on the second carrier substrate, before forming the second temporary bonding layer. The probability of contaminating the second carrier substrate during the process of forming the second temporary bonding layer is reduced by the passivation layer, thereby increasing the reuse rate of the second carrier substrate. The material of the passivation layer may be one of silicon oxide and silicon nitride.

The RDL structure 360 is used to implement electrical integration of the formed camera assembly, and to improve the feasibility of the electrical connection process while reducing the distance between chips and components. In addition, compared to a wire drawing process, the RDL structure 360 can realize mass production and improve packaging efficiency.

For example, forming the RDL structure 360 includes: forming a first dielectric layer 332 on the second temporary bonding layer 331 (as shown in FIG. 7); patterning the first dielectric layer 332, to form an interconnect trench 335 in the first dielectric layer 332 (as shown in FIG. 7) through a thickness of the first dielectric layer 332; filling a conductive material in the interconnect trench 335 to form the RDL structure 360; and removing the first dielectric layer 332.

The interconnect trench 335 in the first dielectric layer 332 is used to define the shape, the location, and the dimensions of the RDL structure 360. In one embodiment, the material of the first dielectric layer 332 is a photosensitive material, and correspondingly patterning can be realized by a photolithography process. For example, the material of the first dielectric layer 332 is one of photosensitive polyimide, photosensitive benzocyclobutene, and photosensitive polybenzoxazole.

In one embodiment, the RDL structure 360 is formed in the interconnect trench 335, and the RDL structure 360 is correspondingly an interconnect line, thereby reducing the process complexity of forming the RDL structure 360. For example, the interconnect trench 335 is filled with a conductive material by an electroplating process.

In one embodiment, the material of the RDL structure 360 is copper. By selecting copper, it is advantageous to improve the electrical connection reliability and the electrical conductivity of the RDL structure 360. In addition, the filling property of copper is better, and the filling quality of the conductive material in the interconnect trench 335 can be correspondingly improved. In other embodiments, the material of the RDL structure may also be other applicable conductive materials.

The material of the first dielectric layer 332 has high corrosion resistance. Therefore, in one embodiment, after the RDL structure 360 is formed, the first dielectric layer 332 is removed by a reactive ion etching process to expose the second temporary bonding layer 331 to make process preparation for subsequent processes.

It should be noted that, in other embodiments, the RDL structure may be formed directly by an etching. For example, forming the RDL structure may include: forming a conductive layer on the second temporary bonding layer; and etching the conductive layer, so that the remaining conductive layer after etching can be used as the RDL structure. In those embodiments, the material of the RDL structure may be a conductive material such as aluminum that can be easily patterned by an etching process.

Figure 9:
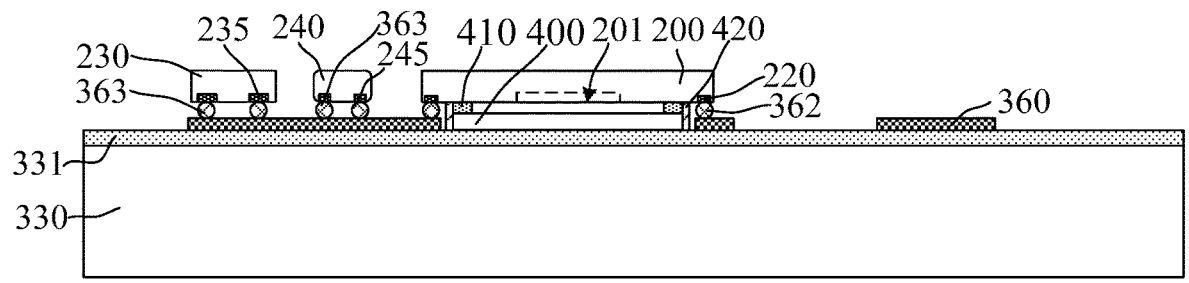

Referring to FIG. 9, functional components (not labeled) are provided, and the functional components have solder pads. The optical filter 400 in the photosensitive unit 250 (shown in FIG. 5) is temporarily bonded with the second carrier substrate 330 and the functional components are placed on the RDL structure 360. The solder pads of the photosensitive chip 200 and the solder pads of the functional components face the RDL structure 360 and electrically connect with the RDL structure 360.

For example, the second UV film 320 (shown in FIG. 6) at the position of each single photosensitive unit 250 is irradiated with ultraviolet light to deactivate the second UV film 320 irradiated with ultraviolet light, and then the photosensitive unit 250 is sequentially peeled off from the second UV film 320 and placed at a predetermined position on the second carrier substrate 330. By placing the photosensitive unit 250 one by one on the second carrier substrate 330, it is advantageous to improve the positional accuracy of the photosensitive unit 250 on the second carrier substrate 330.

In one embodiment, after the optical filter 400 is temporarily bonded with the second carrier substrate 330, the first conductive bumps 362 are in contact with the RDL structure 360.

One embodiment only illustrates one photosensitive unit 250. In other embodiments, when the formed lens module is applied to a dual-camera or array module product, the number of photosensitive units may be two or more.

The functional components are components having specific functions other than the photosensitive chip 200 in the camera assembly, and include at least one of peripheral chips 230 and passive components 240.

In one embodiment, the functional components include peripheral chips 230 and passive components 240.

The peripheral chips 230 are active components, and are used to provide peripheral circuits to the photosensitive chip 200 after being electrically connected with the photosensitive chip 200, for example, analog power supply circuits and digital power supply circuits, voltage buffer circuits, shutter circuits, shutter driving circuits, etc.

In one embodiment, the peripheral chips 230 include one or two of digital signal processor chips and memory chips. In other embodiments, the peripheral chips may also include chips of other functional types. Only one peripheral chip 230 is illustrated in FIG. 9, but the number of peripheral chips 230 is not limited to one.

The peripheral chips 230 are typically silicon-based chips fabricated using integrated circuit fabrication techniques and also have solder pads for electrically connecting the peripheral chips 230 with other chips or components. In one embodiment, the peripheral chips 230 include second chip solder pads 235. The second chip solder pads 235 face the RDL structure 360 after the peripheral chips 230 are placed on the RDL structure 360.

The passive components 240 are used to play a specific role in the photographic operation of the photosensitive chip 200. The passive components 240 can include smaller electronic components such as resistors, capacitors, inductors, diodes, transistors, potentiometers, relays, or drivers. Only one passive component 240 is illustrated in FIG. 9, but the number of passive components 240 is not limited to one.

The passive components 240 also have solder pads for electrical connections of the passive components 240 with other chips or components. In one embodiment, the solder pads of the passive component 240 are electrodes 245. After the passive components 240 are placed on the RDL structure 360, the electrodes 245 face the RDL structure 360.

In one embodiment, before the peripheral chips 230 and the passive components 240 are placed on the RDL structure 360, second conductive bumps 363 are formed on the second chip solder pads 235 and the electrodes 245.

The second conductive bumps 363 protrude from the surface of the peripheral chips 230 and the surface of the passive components 240 as external electrodes of the peripheral chips 230 and the passive components 240, and improve the subsequent electrical connection reliability of the peripheral chips 230 and the passive components 240 with the RDL structure 360.

Moreover, the height difference between a surface of the peripheral chips 230 and the passive components 240 facing away from the second carrier substrate 330 and a surface of the photosensitive chip 200 facing away from the second carrier substrate 330 is reduced by the second conductive bumps 363, thereby being beneficial to reduce process complexity of a subsequent bonding process.

In one embodiment, the second conductive bumps 363 are formed by a ball planting process. The volumes of the balls are generally large, and it is easy to reduce the height difference between the surface of the peripheral chips 230 and the passive elements 240 facing away from the second carrier substrate 330 and the surface of the photosensitive chip 200 facing away from the second carrier substrate 330.

The second conductive bumps 363 are formed before placing the peripheral chips 230 and the passive components 240 on the RDL structure 360, to avoid the influence of the reflow step to adhesiveness of the second temporary bonding layer 331, and other chips or components. In addition, the accuracy of the positions at which the second conductive bumps 363 are formed can be improved. For a detailed description of the second conductive bumps 363, reference may be made to the related description of the first conductive bumps 362, and details are not described herein again.

Correspondingly, after the peripheral chips 230 and the passive components 240 are placed on the RDL structure 360, the second conductive bumps 363 are in contact with the RDL structure 360.

In one embodiment, after the optical filter 400 is temporarily bonded with the second carrier substrate 330 and the functional components are placed on the RDL structure 360, the first conductive bumps 362 and the second conductive bumps 363 are bonded with the RDL structure 360.

For example, the bonding step is performed using a metal bonding process.

In one embodiment, the first conductive bumps 362 and the second conductive bumps 363 are bonded with the RDL structure 360 in a same metal bonding process step, thereby improving packaging efficiency and avoiding negative effects of the process temperature of multiple metal bonding processes.

For example, the metal bonding process is a thermocompression bonding process. During the metal bonding process, the contact surfaces of the first conductive bumps 362, the second conductive bumps 363, and the RDL structure 360 are plastically deformed under pressure, so that atoms at contact surfaces contact with each other. As the bonding process temperature increases, atomic diffusion at the contact surfaces accelerates, and cross-border diffusion is achieved. When a certain bonding process time is reached, lattice at the contact surfaces is reorganized, thereby achieving bonding, with high bonding strength, high electrical and thermal conductivity, high electromigration resistance, and high mechanical connection properties.

It should be noted that as the bonding process temperature increases, the atoms at the contact surfaces get more energy, and the diffusion between the atoms is increased. The increase of the bonding process temperature can also promote growth of crystal grains, and the crystal grains that obtain energy can grow across the interface, which helps to eliminate the interface and integrate the materials at the contact surfaces. However, if the bonding process temperature is too high, it is easy to adversely affect the performance of the photosensitive chip 200 and the peripheral chips 230, especially for the sensitive components in the formed camera assembly. Also the too-high bonding process temperature may cause thermal stress, causing problems such as decreased alignment accuracy, increased process cost, and reduced production efficiency. Therefore, in one embodiment, the metal bonding process is a metal low temperature bonding process, and a bonding process temperature of the metal bonding process is less than or equal to about 250° C. As long as the lowest value of the bonding process temperature is sufficient to achieve the bonding.

At a set bonding process temperature, mutual diffusion between the atoms becomes easier by increasing pressure, thereby improving the bonding quality between the first conductive bumps 362, the second conductive bumps 363, and the RDL structure 360. Therefore, in one embodiment, a bonding process pressure of the metal bonding process is greater than or equal to about 200 kPa. The pressure is generated by a pressing tool.

Increasing the bonding process time also improves the bonding quality. In one embodiment, a bonding process time of the metal bonding process is greater than or equal to about 30 minutes.

It should be noted that, in the actual process, the bonding process temperature, the bonding process pressure, and the bonding process time can be reasonably adjusted and matched to each other, thereby ensuring the quality and the efficiency of the metal bonding process. It should also be noted that to reduce the probability of oxidation or contamination of the contact surfaces, the metal bonding process may be performed in a vacuum environment.

Figure 10:
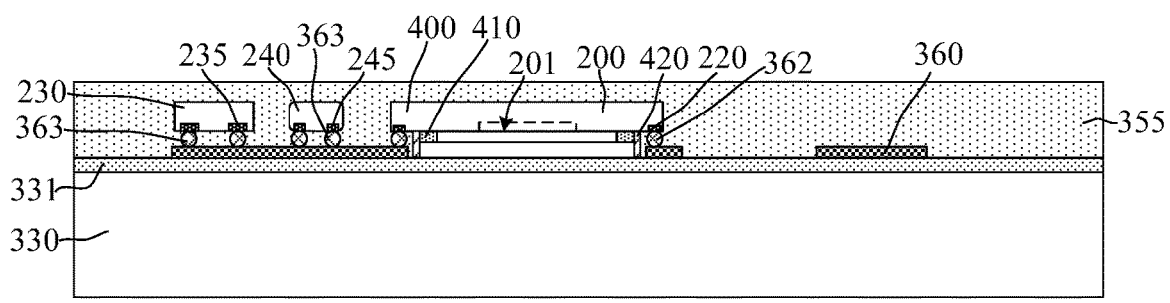
Figure 11:
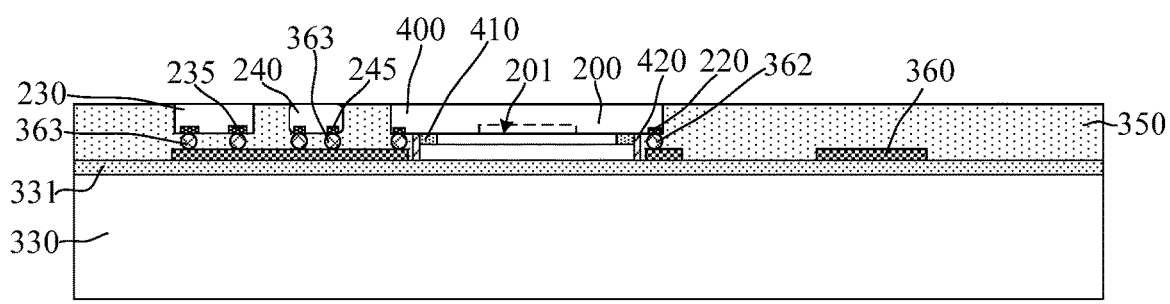

Referring to FIG. 10 and FIG. 11, an encapsulation layer 350 is formed to cover the second carrier substrate 330. The encapsulation layer 350 is coplanar with a highest top of the photosensitive chip 200 and the functional components (not labeled).

The encapsulation layer 350 plays a role to fix the photosensitive chip 200 and the functional components (for example, the peripheral chips 230 and the passive components 240) for implementing package integration of the photosensitive chip 200 and the functional components.

The encapsulation layer 350 can reduce the space occupied by a support member in a lens assembly, and can also omit a circuit board (for example, a printed circuit board (PCB)), thereby significantly reducing the overall thickness of the subsequently formed lens module to meet the needs for miniaturization and thinning the lens module. Moreover, compared to a scheme of mounting the functional components on a peripheral motherboard, by integrating the photosensitive chip and the functional components in the encapsulation layer 350, the distance between the photosensitive chip 200 and the functional components can be reduced, thereby being beneficial to accordingly shorten the distance of the electrical connections between the photosensitive chip and the functional components, to significantly increase the speed of signal transmission, and improve the performance of the lens module (for example, improving the shooting speed and the storage speed).

The encapsulation layer 350 is made of a molding material, and can also function as an insulator, a seal, and a moisture barrier, thereby improving the reliability of the lens module. In one embodiment, the material of the encapsulation layer 350 is an epoxy resin. An epoxy resin has the advantages of low shrinkage, good adhesion, good corrosion resistance, excellent electrical properties, and low cost, so it is widely used as an encapsulating material for electronic devices and integrated circuits.

For example, forming the encapsulation layer 350 includes: forming an encapsulation material layer 355 (shown in FIG. 10), covering the second carrier substrate 330, the photosensitive chip 200, and the functional components; and performing a planarizing process on the encapsulation material layer 355 to form the encapsulation layer 350, which is coplanar with the highest top of the photosensitive chip 200 and the functional components.

In one embodiment, the encapsulating material layer 355 is formed by an injection molding process. The injection molding process has the characteristics of high production speed, high efficiency, and automation of operation. Through the injection molding process, it is beneficial to increase the output and reduce the process cost. In other embodiments, the encapsulation layer may also be formed using other molding processes.

The encapsulating material layer 355 covers the photosensitive chip 200 and the functional components, and the process of forming the encapsulating layer 350 is prevented from being affected by the thickness difference between the photosensitive chip 200 and the functional components. Accordingly, it is not required to customize molds for the injection molding process and the process is simple.

Moreover, the encapsulation layer 350 also covers the sidewalls of the optical filter 400, thereby improving the sealing property of the cavity in the photosensitive unit 250, and reducing the probability of water vapor, oxidizing gas, etc., entering the cavity. The performance of the photosensitive chip 200 is guaranteed.

In addition, the photosensitive unit 250, the functional components, and the RDL structure 360 are all located in the encapsulation layer 350, so that the photosensitive unit 250, the functional components, and the RDL structure 360 are all protected, which is beneficial to improve the reliability and the stability of the camera assembly.

It should be noted that, with use of the encapsulation layer 350, a circuit board is omitted, and the overall thickness of the lens module can be reduced. Therefore, the photosensitive chip 200 and the peripheral chips 230 don't need to be thinned. The mechanical strength and the reliability of the photosensitive chip 200 and the peripheral chips 230 are improved. In other embodiments, the thickness of the photosensitive chip and the peripheral chips may be appropriately reduced according to process requirements, but the amount of thinning is small to ensure that the mechanical strength and the reliability are not affected.

In one embodiment, the thickness of the encapsulation layer 350 is made small by the planarizing process, thereby further reducing the overall thickness of the formed lens module. In other embodiments, the planarizing process may not be performed to simplify the packaging process, and the formed encapsulation layer correspondingly covers the photosensitive chip and the functional components.

Figure 12:
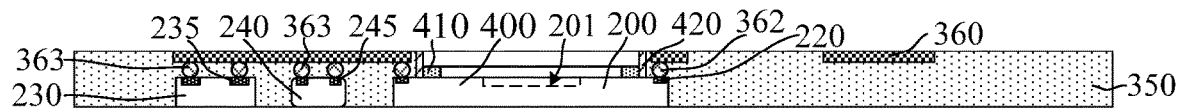

Referring to FIG. 12, a second debonding process is performed to remove the second carrier substrate 330 (shown in FIG. 11).

In one embodiment, the second debonding process includes sequentially removing the second carrier substrate 330 and the second temporary bonding layer 331 (as shown in FIG. 11). For a detailed description of the second debonding process, reference may be made to the foregoing description of the first debonding process, and details are not described herein again.

Figure 13:
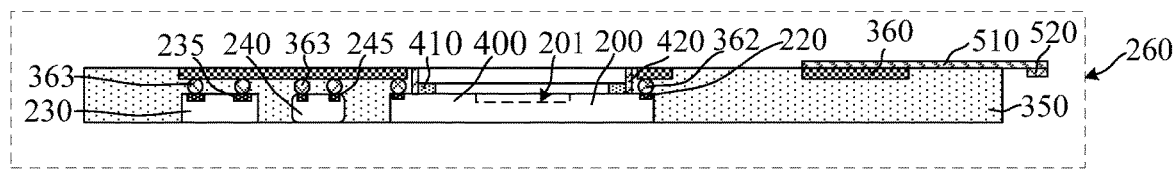

Referring to FIG. 13, after the second debonding process, a dicing process is performed on the encapsulation layer 350.

Through the dicing process, a single camera assembly 260 sized to meet the process requirements is formed to prepare the process for subsequent assembly of the lens assembly. In one embodiment, the dicing process is performed using a laser cutting process.

Continuing to refer to FIG. 13, after the second carrier substrate 330 is removed (as shown in FIG. 11), a flexible printed circuit (FPC) board 510 is bonded with a portion of the RDL structure 360 exposed from the encapsulation layer 350.

The FPC board 510 is configured to implement electrical connections between the camera assembly 260 and subsequent lens components and electrical connections between a formed lens module and other components in the case when a circuit board is omitted. After subsequently forming the lens module, the lens module can also be electrically connected with other components in an electronic device by the FPC board 510, thereby implementing a normal camera function of the electronic device.

In one embodiment, the FPC board 510 has a circuit structure. Therefore, the FPC board 510 is bonded with the RDL structure 360 by a metal bonding process, thereby achieving electrical connection.

In one embodiment, to improve process feasibility, the FPC board 510 is bonded with the RDL structure 360 after the second debonding process and the dicing process.

It should be noted that a connector 520 is formed on the FPC board 510 for electrically connecting the FPC board 510 with other circuit components. When the lens module is applied to an electronic device, the connector 520 is electrically connected with the motherboard of the electronic device, thereby realizing information transmission between the lens module and other components in the electronic device, to transmit image information from the lens module to the electronic device. For example, the connector 520 can be a golden finger connector.

Figure 14:
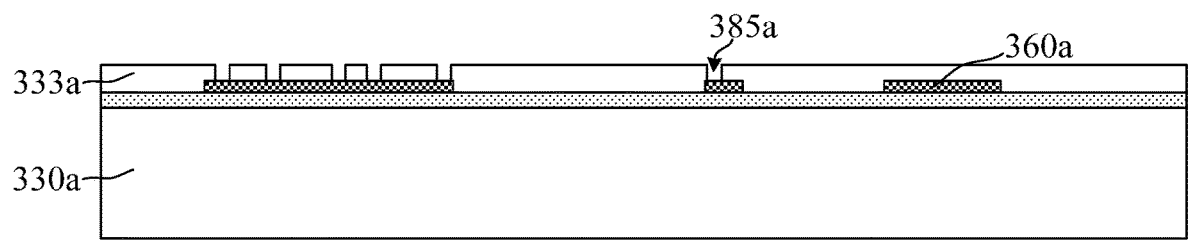
FIGS. 14-16 illustrate schematic cross-sectional views of structures corresponding to certain stages during another exemplary packaging method of a camera assembly according to some exemplary embodiments of the present disclosure.
Figure 15:
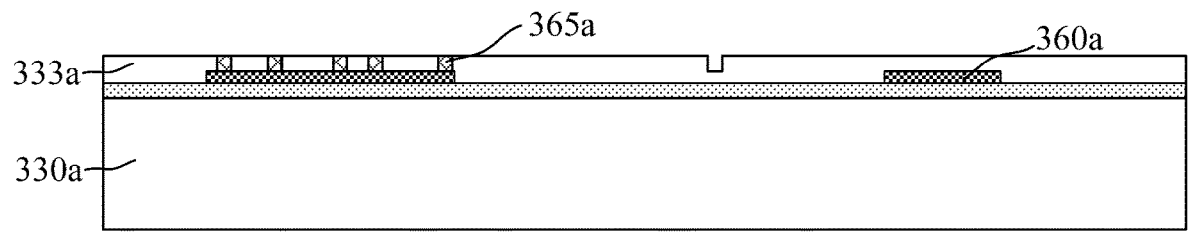
Figure 16:
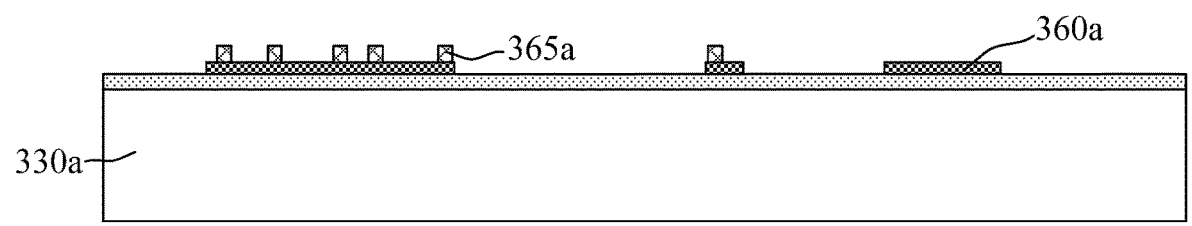

FIGS. 14-16 illustrate schematic cross-sectional views of structures corresponding to certain stages during another exemplary packaging method of a camera assembly according to some exemplary embodiments of the present disclosure.

Same steps of another exemplary packaging method according to some exemplary embodiments as those according to the foregoing embodiments are not described herein again. One embodiment differs from the foregoing embodiments in that a plurality of conductive bumps 365a (shown in FIG. 15) is formed on a RDL structure 360a.

For example, forming the plurality of conductive bumps 365a on the RDL structure 360a is described as follows.

Referring to FIG. 14, a second dielectric layer 333a is formed to cover a second carrier substrate 330a and the RDL structure 360a. The second dielectric layer 333a is patterned, and interconnect vias 385a are formed in the second dielectric layer 333a to expose a portion of the RDL structure 360a.

The interconnect vias 385a are used to provide space to form subsequent conductive bumps.

For a detailed description of the second dielectric layer 333a and the process of forming the interconnect vias 385a, reference may be made to the related description of the first dielectric layer and the interconnect trench in the foregoing embodiments, and details are not described herein again.

Referring to FIG. 15, a conductive material is filled in the interconnect vias 385a (shown in FIG. 14) to form the plurality of conductive bumps 365a.

In one embodiment, the conductive material is filled by an electroplating process. Correspondingly, the material of the plurality of conductive bumps 365a may also be the same as the material of the RDL structure 360a.

Referring to FIG. 16, the second dielectric layer 333a is removed (as shown in FIG. 14).

In one embodiment, the second dielectric layer 333a is removed by a reactive ion etching process.

Correspondingly, subsequently after an optical filter of a photosensitive unit is temporarily bonded with the second carrier substrate 330a, and functional components are placed on the RDL structure 360a, solder pads of the photosensitive chip and solder pads of the functional components are bonded with the corresponding plurality of conductive bumps 365a.

For a detailed description of the subsequent steps, reference may be made to the corresponding description in the foregoing embodiments, and details are not described herein again.

FIGS. 17-20 illustrate schematic cross-sectional views of structures corresponding to certain stages during another exemplary packaging method of a camera assembly according to some exemplary embodiments of the present disclosure.

Figure 20:
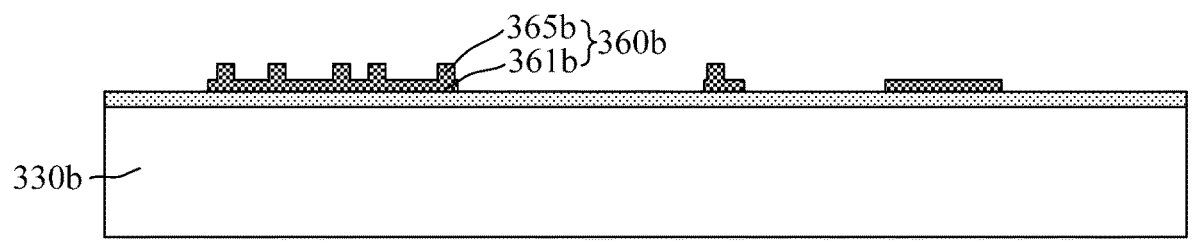

Same steps of another exemplary packaging method according to some exemplary embodiments as those according to the foregoing embodiments are not described herein again. One embodiment differs from the foregoing embodiments in that, as shown in FIG. 20, a formed RDL structure 360b includes an interconnection line 361b and conductive pillars 365b protruding from the interconnection line 361b.

For example, forming the RDL structure 360b on a second carrier substrate 330b is described as follows.

Figure 17:
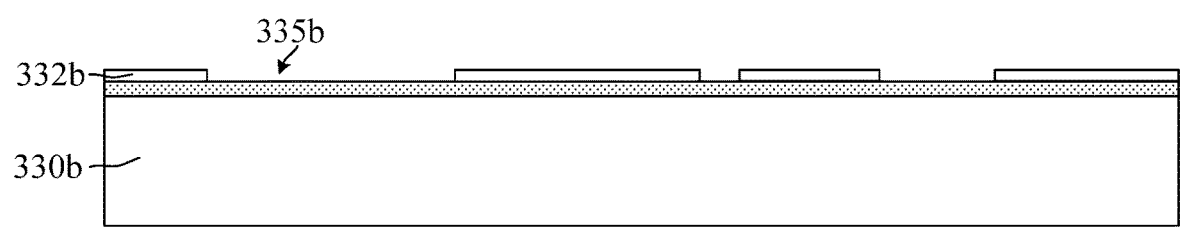
FIGS. 17-20 illustrate schematic cross-sectional views of structures corresponding to certain stages during another exemplary packaging method of a camera assembly according to some exemplary embodiments of the present disclosure.

Referring to FIG. 17, a first dielectric layer 332b is formed on the second carrier substrate 330b. The first dielectric layer 332b is patterned, and an interconnect trench 335b is formed in the first dielectric layer 332b through a thickness of the first dielectric layer 332b.

The interconnect trench 335b is used to define the shape, the location, and the dimensions of a subsequently formed interconnect line.

For a detailed description of the first dielectric layer 332b, reference may be made to the corresponding description in the foregoing embodiments, and details are not described herein again.

Figure 18:
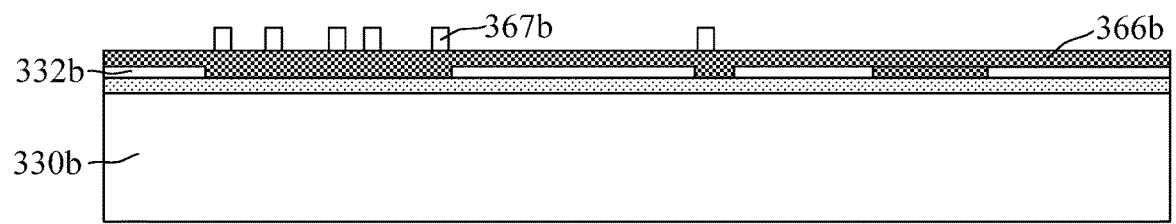

Referring to FIG. 18, a conductive material 366b is filled into the interconnect trench 335b (shown in FIG. 17), and the conductive material 366b also covers a top of the first dielectric layer 332b. A patterned mask layer 367b is formed on the conductive material 366b and the patterned mask layer 367b blocks the conductive material 366b at locations of subsequent conductive pillars.

In one embodiment, the interconnect trench 335b is filled with the conductive material 366b by an electroplating process.

In one embodiment, the conductive material 366b is copper. By selecting copper, it is beneficial to improve the reliability of the electrical connection of the RDL structure. The resistivity of copper is low, so that the electrical conductivity of the RDL structure is also improved. In addition, the filling property of copper is good, the filling effect of the conductive material 366b in the interconnect trench 335b can be accordingly improved. In other embodiments, other suitable conductive materials may also be selected.

The patterned mask layer 367b is used as an etching mask to subsequently etch the conductive material 366b. In one embodiment, the material of the patterned mask layer 367 is a photoresist. In other embodiments, the mask layer may also be selected from other materials suitable for the etching process, and the mask layer may be a single layer structure or a laminated structure.

Figure 19:
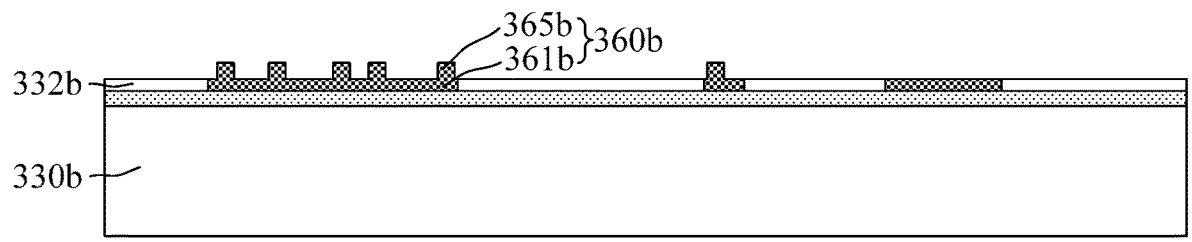

Referring to FIG. 19, the conductive material 366b (shown in FIG. 18) is etched to the first dielectric layer 332b by using the patterned mask layer 367b as a mask, to form the interconnection line 361b in the interconnect trench 335b (shown in FIG. 17) and the conductive pillars 365b protruding from the interconnect line 361b. The interconnect line 361b and the conductive pillars 365b constitute the RDL structure 360b.

In one embodiment, the conductive material 366b may be etched by a dry etching to improve the morphological quality of the RDL structure 360b.

Referring to FIG. 20, the patterned mask layer 367b (shown in FIG. 19) and the first dielectric layer 332b (shown in FIG. 19) are removed.

In one embodiment, the material of the patterned mask layer 367b is a photoresist, so the patterned mask layer 367b can be removed by an ashing or a wet stripping.

The material of the first dielectric layer 332b has strong corrosion resistance. Therefore, the first dielectric layer 332b is removed by a reactive ion etching process, and the interconnect line 361b is exposed from the second carrier substrate 330b, thereby preparing the process for subsequent electrical connection process.

Correspondingly, subsequently after an optical filter of a photosensitive unit is temporarily bonded with the second carrier substrate 330b and functional components are placed on the RDL structure 360b, solder pads of the photosensitive unit and solder pads of the functional components are bonded with the corresponding conductive pillars 365b.

For a detailed description of the subsequent steps, reference may be made to the corresponding description in the foregoing embodiments, and details are not described herein again.

Correspondingly, one embodiment of the present disclosure further provides a camera assembly. With continued reference to FIG. 13, a schematic cross-sectional view of a camera assembly according to one embodiment of the present disclosure is shown.

A camera assembly 260 includes an encapsulation layer 350, embedded with a photosensitive unit 250 (shown in FIG. 5), functional components (not labeled), and a RDL structure 360. The photosensitive unit 250 includes a photosensitive chip 200 and an optical filter 400 mounted on the photosensitive chip 200. A top surface of the encapsulation layer 350 exposes the RDL structure 360 and the optical filter 400, and a bottom surface of the encapsulation layer 350 exposes a highest top of the photosensitive chip 200 and the functional components. The photosensitive chip 200 and the functional components have solder pads facing the RDL structure 360 and electrically connecting with the RDL structure 360.

The encapsulation layer 350 plays a role to fix the photosensitive chip 200, the functional components, and the RDL structure 360 for implementing package integration of the photosensitive chip 200, the functional components, and the RDL structure 360. The encapsulation layer 350 reduces the space occupied by a support member in a lens assembly, and also omits a circuit board, thereby reducing the overall thickness of a lens module and meeting the needs of miniaturization and thinning of the lens module.

The material of the encapsulation layer 350 is a plastic encapsulation material, and the encapsulation layer 350 can also function as an insulator, a seal, and a moisture barrier, thereby also improving the reliability of the lens module. In one embodiment, the material of the encapsulation layer 350 is an epoxy resin.

In one embodiment, the encapsulation layer 350 includes a top surface and a bottom surface opposite to each other. The top surface of the encapsulation layer 350 is a surface for mounting the lens assembly.

In one embodiment, the top surface of the encapsulation layer 350 exposes the RDL structure 360 and the optical filter 400, and the bottom surface of the encapsulation layer 350 exposes the highest top of the photosensitive chip 200 and the functional components. Correspondingly, the process of forming the encapsulation layer 350 is prevented from being affected by the thickness difference between the photosensitive chip 200 and the functional components. In the process of forming the encapsulation layer 350, a customized mold is not required, and the process is simple.

Correspondingly, the encapsulation layer 350 also covers sidewalls of the optical filter 400, thereby improving the sealing property of the cavity in the photosensitive unit 250, reducing the probability of water vapor, oxidizing gas, etc., entering the cavity, so that the performance of the photosensitive chip 200 is guaranteed. In addition, the photosensitive unit 250, the functional components, and the RDL structure 360 are all located within the encapsulation layer 350 to improve the reliability and the stability of the camera assembly.

The photosensitive chip 200 is an image sensor chip. In some embodiments, the photosensitive chip 200 is a CMOS image sensor chip. In other embodiments, the photosensitive chip may also be a CCD image sensor chip.

In one embodiment, the photosensitive chip 200 includes a photosensitive region 200C (shown in FIG. 2) and a peripheral region 200E (shown in FIG. 2) surrounding the photosensitive region 200C. The photosensitive chip 200 further has an optical signal receiving surface 201 located at the photosensitive region 200C.

The photosensitive chip 200 is typically a silicon-based chip, and solder pads of the photosensitive chip 200 are used to electrically connect the photosensitive chip 200 with other chips or components. In one embodiment, the photosensitive chip 200 has first chip solder pads 220 located in the peripheral region 200E.

In one embodiment, the first chip solder pads 220 face the RDL structure 360, thereby achieving electrical connections between the first chip solder pads 220 and the RDL structure 360.

The optical signal receiving surface 201 of the photosensitive chip 200 faces the optical filter 400, and the photosensitive chip 200 is attached to the optical filter 400 to prevent the packaging process from contaminating the optical signal receiving surface 201. By a means of attaching, the overall thickness of the lens module is reduced.

The optical filter 400 can be an infrared filter glass sheet or a fully transparent glass sheet. In one embodiment, the optical filter 400 is an infrared filter glass sheet, and is also used to eliminate the influence of infrared light in the incident light on the performance of the photosensitive chip 200, and is advantageous for improving the imaging effect.

In one embodiment, the optical filter 400 and the photosensitive chip 200 are combined by an adhesive structure 410 disposed therebetween, and the adhesive structure 410 surrounds the optical signal receiving surface 201 of the photosensitive chip 200.

The adhesive structure 410 is used to achieve physical connection between the optical filter 400 and the photosensitive chip 200. Moreover, the optical filter 400 is prevented from being in direct contact with the photosensitive chip 200, thereby avoiding adverse effects on the performance of the photosensitive chip 200. In one embodiment, the material of the adhesive structure 410 is a photolithographic dry film. In other embodiments, the material of the adhesive structure may also be one of a photolithographic polyimide, a photolithographic polybenzoxazole, and a photolithographic benzocyclobutene.

In one embodiment, the adhesive structure 410 surrounds the optical signal receiving surface 201 such that the optical filter 400 above the optical signal receiving surface 201 is located on the photosensitive path of the photosensitive chip 200, therefore the performance of the photosensitive chip 200 is guaranteed.

It should be noted that one embodiment only illustrates one photosensitive unit 250. In other embodiments, when the lens module is applied to a dual-camera or array module product, the number of photosensitive units may be two or more.

In one embodiment, the camera assembly 260 further includes a stress buffer layer 420 between the encapsulation layer 350 and sidewalls of the optical filter 400. The stress buffer layer 420 is advantageous for reducing stress generated by the encapsulation layer 350 on the optical filter 400 to reduce the probability of the optical filter 400 being broken, thereby improving the reliability of the camera assembly 260. In one embodiment, the stress buffer layer 420 is a photosensitive buffer.

For example, the material of the stress buffer layer 420 is an epoxy adhesive. An epoxy adhesive is an epoxy resin. An epoxy adhesive also has a variety of forms. By changing the composition, materials with different elastic modulus can be obtained, so that the stress received by the optical filter 400 can be regulated according to actual conditions.

In one embodiment, the stress buffer layer 420 is further located between the encapsulation layer 350 and the sidewalls of the adhesive structure 410, thereby reducing the stress generated by the encapsulation layer 350 on the adhesive structure 410, which is beneficial to further improve the reliability and the yield of the camera assembly 260.

The RDL structure 360 is used to implement electrical connections between the various chips and components in the camera assembly 260. By selecting the RDL structure 360, the feasibility of the electrical connection process can be improved while reducing the distance between the chips and the components. The RDL structure 360 can realize mass production and improve packaging efficiency.

In one embodiment, the RDL structure 360 is an interconnect line, thereby reducing the process complexity of forming the RDL structure 360.

In one embodiment, the material of the RDL structure 360 is copper.

In one embodiment, to improve the electrical connection reliability of first chip solder pads 220 and the RDL structure 360, the camera assembly 260 further includes: first conductive bumps 362 located between the first chip solder pads 220 and the RDL structure 360.

In one embodiment, the first conductive bumps 362 are planting balls. By selecting the planting balls, the volumes of the first conductive bumps 362 are made larger, and the contact of the first conductive bumps 362 with the RDL structure 360 is easily realized.

The functional components are components having specific functions other than the photosensitive chip 200 in the camera assembly, and include at least one of peripheral chips 230 and passive components 240.

In one embodiment, the functional components include the peripheral chips 230 and the passive components 240.

The peripheral chips 230 are active components for providing peripheral circuits to the photosensitive chip 200.

In one embodiment, the peripheral chips 230 include one or two of digital signal processor chips and memory chips. In other embodiments, the peripheral chips may also include chips of other functional types. Only one peripheral chip 230 is illustrated in FIG. 13, but the number of peripheral chips 230 is not limited to one.

The peripheral chips 230 are typically silicon-based chips, and solder pads of the peripheral chips 230 are used to realize electrical connections of the peripheral chips 230 with other chips or components. In one embodiment, the peripheral chips 230 include second chip solder pads 235, and the second chip solder pads 235 face the RDL structure 360, thereby achieving electrical connections between the second chip solder pads 235 and the RDL structure 360.

The passive components 240 are used to play a specific role for the photographic operation of the photosensitive chip 200. The passive components 240 can include smaller electronic components such as resistors, capacitors, inductors, diodes, transistors, potentiometers, relays, or drivers. Only one passive component 240 is illustrated in FIG. 13, but the number of passive components 240 is not limited to one.

Solder pads of the passive components 240 are used to realize electrical connections of the passive components 240 with other chips or components. In one embodiment, the solder pads of the passive components 240 are electrodes 245, and the electrodes 245 face the RDL structure 360, thereby achieving electrical connections between the electrodes 245 and the RDL structure 360.

In one embodiment, the camera assembly 260 further includes: second conductive bumps 363 between the second chip solder pads 235 and the RDL structure 360, and between the electrodes 245 and the RDL structure 360. The second conductive bumps 363 protrude from a surface of the peripheral chips 230 and a surface of the passive components 240, improving the reliability of electrical connections of the peripheral chips 230, the passive components 240, and the RDL structure 360.

In one embodiment, the second conductive bumps 363 are planting balls.

It should be noted that, in other embodiments, the RDL structure may also include an interconnect line and conductive pillars protruding from the interconnect line, and the conductive pillars are located between the interconnect line and the corresponding solder pads. In those embodiments, the camera assembly correspondingly does not include the first conductive bumps and the second conductive bumps.

In one embodiment, the camera assembly 260 further includes a flexible printed circuit (FPC) board 510 located on the RDL structure 360. The FPC board 510 is used to realize electrical connection between the camera assembly 260 and the lens assembly, and electrical connection between the lens module and other components in the case when a circuit board is omitted.

For example, the FPC board 510 is bonded with the RDL structure 360.

In one embodiment, the FPC board 510 is an FPC board. The lens module is electrically connected with other components in an electronic device through the FPC board 510, thereby implementing a normal camera function of the electronic device.

It should be noted that the FPC board 510 is provided with a connector 520. For example, the connector 520 can be a golden finger connector.

The camera assembly according to one embodiment may be formed by using the packaging method described in the foregoing embodiments, or may be formed by other packaging methods. For a detailed description of the camera assembly of one embodiment, reference may be made to the corresponding description in the foregoing embodiments, and details are not described herein again.

Figure 21:
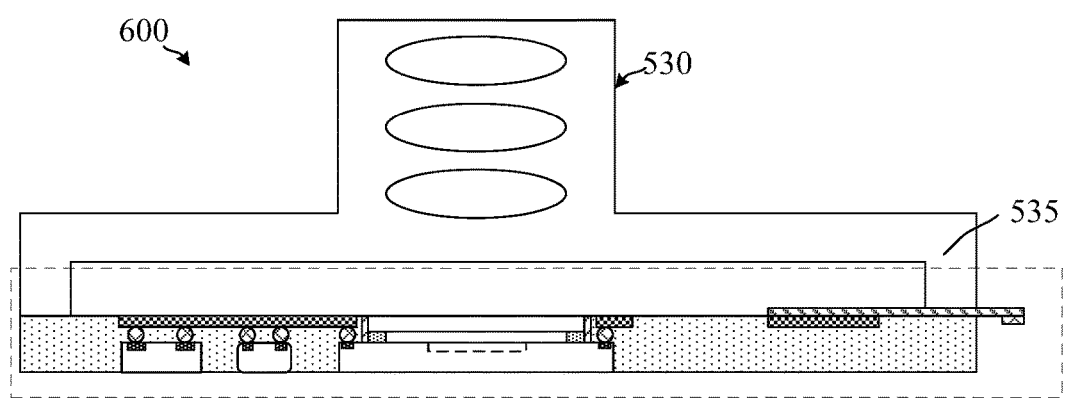
FIG. 21 is a schematic cross-sectional view of a lens module according to an exemplary embodiment of the present disclosure.

Correspondingly, one exemplary embodiment of the present disclosure further provides a lens module. Referring to FIG. 21, a schematic cross-sectional view of a lens module according to an exemplary embodiment of the present disclosure is shown.

A lens module 600 includes: a camera assembly according to exemplary embodiments of the present disclosure (shown by a dash line in FIG. 21); and a lens assembly 530 including a support member 535. The support member 535 is mounted on a top surface of an encapsulation layer (not labeled) and surrounds a photosensitive unit (not labeled) and functional components. The lens assembly 530 is electrically connected with the photosensitive unit (not labeled) and the functional components (not labeled).

The lens assembly 530 generally includes the support member 535, a motor (not shown) mounted on the support member 535, and a lens group (not labeled) mounted on the motor. The support member 535 is used to achieve assembly of the lens assembly 530 and place the lens group on the photosensitive path of the photosensitive unit.

In one embodiment, the thickness of the camera assembly is small, and the thickness of the lens assembly 530 is reduced by the encapsulation layer, thereby reducing the overall thickness of the lens module 600.

Moreover, the photosensitive unit and the functional components are disposed inside the support member 535, thereby improving the signal transmission speed of the lens module 600, thereby improving the performance of the lens module 600 (for example, improving the shooting speed and the storage speed).

The photosensitive unit, the functional components, and a RDL structure are integrated in the encapsulation layer and disposed inside the support member 535, so that the photosensitive unit, the functional components, and the RDL structure are protected, which is beneficial to improve the reliability and the stability of the lens module 600 and ensure the imaging quality of the lens module 600.

In one embodiment, a flexible printed circuit (FPC) board is bonded with the RDL structure, so that one part of the support member 535 is mounted on the encapsulation layer, and another part of the support member 535 is mounted on the FPC board. The motor in the lens assembly 530 is electrically connected with the photosensitive unit and the functional components through the FPC board, thereby achieving electrical connection between the lens assembly 530 and the camera assembly.

It should be noted that, for a detailed description of the camera assembly according to one embodiment, reference may be made to the corresponding description in the foregoing embodiments, and details are not described herein again.

Figure 22:
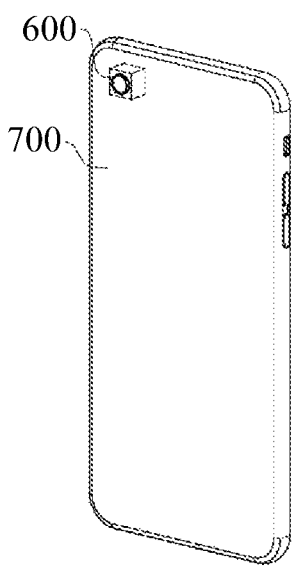
FIG. 22 is a schematic cross-sectional view of an electronic device according to an exemplary embodiment of the present disclosure.

Correspondingly, one exemplary embodiment of the present disclosure further provides an electronic device. Referring to FIG. 22, a schematic cross-sectional view of an electronic device according to an exemplary embodiment of the present disclosure is shown.

In one embodiment, an electronic device 700 includes a lens module 600 according to one embodiment of the present disclosure.

The reliability and the performance of the lens module 600 are relatively high, and the shooting quality, the shooting speed, and the storage speed of the electronic device 700 are correspondingly improved. Moreover, the overall thickness of the lens module 600 is small, which is beneficial to improve user experience.

For example, the electronic device 700 may be various devices having a camera function such as a mobile phone, a tablet computer, a camera, or a video camera.

As disclosed, the technical solution of the exemplary embodiments of the present disclosure has the following advantages.

In exemplary embodiments of the present disclosure, the photosensitive chip and the functional components are integrated in the encapsulation layer, and the RDL structure is used to realize the electrical connections. Compared to a scheme of mounting the functional components on a peripheral motherboard, the exemplary embodiments of the present disclosure reduce the distance between the photosensitive chip and the functional components, accordingly shorten the distance of the electrical connections between the photosensitive chip and the functional components, thereby significantly increasing the speed of signal transmission, thereby improving the performance of the lens module (for example, improving the shooting speed and the storage speed). Moreover, through the encapsulation layer and the RDL structure, a circuit board (for example, a Printed Circuit Board (PCB)) is omitted, thereby reducing the overall thickness of the lens module, to meet the needs of miniaturization and thinning of the lens module.

Although the present disclosure has been disclosed above, the present disclosure is not limited thereto. Any changes and modifications may be made by those skilled in the art without departing from the spirit and scope of the disclosure, and the scope of the disclosure should be determined by the scope of the claims.

What is claimed is:

1. A packaging method of a camera assembly, comprising:
providing a carrier substrate and forming a redistribution layer (RDL) structure on the carrier substrate;
providing functional components having solder pads;
forming a photosensitive unit, comprising a photosensitive chip and an optical filter mounted on the photosensitive chip, wherein the photosensitive chip has solder pads facing the optical filter;
attaching the photosensitive unit to a UV film by temporarily bonding the photosensitive chip of the photosensitive unit with the UV film;

after attaching the photosensitive unit to a UV film, temporarily bonding the optical filter of the photosensitive unit with the carrier substrate, and placing the functional components on the RDL structure, wherein the optical filter of the photosensitive unit and the carrier substrate are on opposite sides of the photosensitive chip, each of the solder pads of the photosensitive chip and the solder pads of the functional components faces the RDL structure and electrically connects with the RDL structure;

irradiating ultraviolet light on the UV film to remove the UV film after bonding the optical filter of the photosensitive unit on the carrier substrate;

forming an encapsulation layer covering the carrier substrate, wherein the encapsulation layer is coplanar with a highest top of the photosensitive chip and the functional components; and removing the carrier substrate.

2. The method according to claim 1, wherein forming the RDL structure on the carrier substrate comprises:

forming a first dielectric layer on the carrier substrate;
patterning the first dielectric layer and forming an interconnect trench in the first dielectric layer through a thickness of the first dielectric layer;
filling the interconnect trench with a conductive material to form the RDL structure; and
removing the first dielectric layer.

3. The method according to claim 1, wherein forming the RDL structure on the carrier substrate comprises:

forming a first dielectric layer on the carrier substrate;
patterning the first dielectric layer and forming an interconnect trench in the first dielectric layer through a thickness of the first dielectric layer;
filling the interconnect trench with a conductive material, wherein the conductive material also covers a top of the first dielectric layer;
forming a patterned mask layer on the conductive material, wherein the patterned mask layer shields a portion of the conductive material to define positions of conductive pillars;
etching the conductive material to the first dielectric layer by using the patterned mask layer as a mask to form an interconnect line in the interconnect trench and the conductive pillars protruding from the interconnect line; and
removing the patterned mask layer and the first dielectric layer.

4. The method according to claim 2, further comprising:
forming conductive bumps on the RDL structure, before temporarily bonding the optical filter of the photosensitive unit with the carrier substrate, and placing the functional components on the RDL structure; and
bonding the solder pads of the photosensitive chip and the solder pads of the functional components with corresponding conductive bumps, after temporarily bonding the optical filter of the photosensitive unit with the carrier substrate, and placing the functional components on the RDL structure.

5. The method according to claim 4, wherein forming the conductive bumps on the RDL structure comprises:
forming a second dielectric layer covering the carrier substrate and the RDL structure;
patterning the second dielectric layer and forming interconnect vias in the second dielectric layer to expose a portion of the RDL structure;
filling the interconnect vias with a conductive material to form the conductive bumps; and
removing the second dielectric layer.

6. The method according to claim 2, further comprising:
forming conductive bumps on the solder pads of the photosensitive chip and the solder pads of the functional components respectively, before temporarily bonding the optical filter of the photosensitive unit with the carrier substrate, and placing the functional components on the RDL structure; and
bonding the conductive bumps on the solder pads of the photosensitive chip and the conductive bumps on the solder pads of the functional components with the RDL structure, after temporarily bonding the optical filter of the photosensitive unit with the carrier substrate, and placing the functional components on the RDL structure.

7. The method according to claim 3, further comprising:
bonding the solder pads of the photosensitive chip and the solder pads of the functional components with corresponding conductive pillars, after temporarily bonding the optical filter of the photosensitive unit with the carrier substrate, and placing the functional components on the RDL structure.

8. The method according to claim 1, wherein:
the solder pads of the photosensitive chip and the solder pads of the functional components electrically are connected with the RDL structure by a metal bonding process,
wherein the metal bonding process has a bonding process temperature of less than or equal to about 250° C., a bonding process pressure of greater than or equal to about 200 kPa, and a bonding process time of greater than or equal to about 30 minutes.

9. The method according to claim 1, wherein forming the encapsulation layer comprises:
forming an encapsulation material layer covering the carrier substrate, the photosensitive chip, and the functional components; and
planarizing the encapsulation material layer to form the encapsulation layer, wherein the encapsulation layer is coplanar with the highest top of the photosensitive chip and the functional components.

10. The method according to claim 1, further comprising:
forming a stress buffer layer covering sidewalls of the optical filter, before temporarily bonding the optical filter of the photosensitive unit with the carrier substrate.

11. The method according to claim 1, further comprising:
bonding a flexible printed circuit (FPC) board with a portion of the RDL structure exposed by the encapsulation layer, after removing the carrier substrate.

12. The method according to claim 10, wherein
the stress buffer layer is forded directly on the sidewalk of the optical filter and sandwiched by the encapsulation layer and the sidewalls of the optical filter for reducing stress generated by the encapsulation on the optical filter.

* * * * *